US009632436B2

(12) United States Patent
Schmidt et al.

(10) Patent No.: US 9,632,436 B2
(45) Date of Patent: Apr. 25, 2017

(54) OPTICAL ASSEMBLY WITH SUPPRESSION OF DEGRADATION

(71) Applicant: CARL ZEISS SMT GmbH, Oberkochen (DE)

(72) Inventors: Stefan-Wolfgang Schmidt, Aalen (DE); Dirk Heinrich Ehm, Lauchheim (DE); Markus Walter, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 338 days.

(21) Appl. No.: 14/160,710

(22) Filed: Jan. 22, 2014

(65) Prior Publication Data

US 2014/0176921 A1    Jun. 26, 2014

Related U.S. Application Data

(63) Continuation of application No. PCT/EP2012/063101, filed on Jul. 5, 2012.

(30) Foreign Application Priority Data

Jul. 20, 2011    (DE) ........................ 10 2011 079 450

(51) Int. Cl.
*G03B 27/52* (2006.01)
*G03B 27/54* (2006.01)
*G03F 7/20* (2006.01)

(52) U.S. Cl.
CPC ...... *G03F 7/70883* (2013.01); *G03F 7/70891* (2013.01); *G03F 7/70916* (2013.01); *G03F 7/70925* (2013.01); *G03F 7/70983* (2013.01)

(58) Field of Classification Search
CPC ............. G03F 7/70883; G03F 7/70891; G03F 7/70341

(Continued)

(56) References Cited

U.S. PATENT DOCUMENTS 6,731,371 B1 * 5/2004 Shiraishi ................ G03B 27/52
                                                     250/492.2
6,876,494 B2 * 4/2005 Ishikawa ............ G02B 26/0841
                                                       355/67

(Continued)

FOREIGN PATENT DOCUMENTS

DE            103 21 103 A1    12/2004
DE    10 2006 042 987 A1    4/2008

(Continued)

OTHER PUBLICATIONS

International Search Report for PCT/EP2012/063101 dated Nov. 8, 2012.

(Continued)

*Primary Examiner* — Hung Henry Nguyen
(74) *Attorney, Agent, or Firm* — Edell, Shapiro & Finnan, LLC

(57) ABSTRACT

An optical assembly including: a beam generating system generating radiation (6) at an operating wavelength, an optical element (13, 14) arranged in a residual gas atmosphere (16) and subjected to the radiation, which induces a degradation of a surface of the optical element, and a feed device feeding at least one gaseous constituent into the residual gas atmosphere, to suppress the degradation of the surface. Either a beam diameter (d) of the radiation at the surface of the optical element, lies above a threshold value ($d_c$), thereby suppressing the degradation by the gaseous constituent, or, if the beam diameter (d) at the surface (14a) of the optical element (14) lies below the threshold value ($d_c$) so that the effectiveness of the suppression of the degradation is reduced, at least one further device (25, 27) enhancing suppression of the degradation of the surface (14a) is assigned to the optical element (14).

17 Claims, 2 Drawing Sheets

Related U.S. Application Data

(60) Provisional application No. 61/509,733, filed on Jul. 20, 2011.

(58) Field of Classification Search
USPC .......................................... 355/30, 52, 55, 67
See application file for complete search history.

(56) References Cited

U.S. PATENT DOCUMENTS

| | | | |
|---|---|---|---|
| 7,106,412 B2* | 9/2006 | De Bokx | G03F 7/70933 355/30 |
| 2004/0046949 A1 | 3/2004 | Ohgushi et al. | |
| 2007/0054497 A1 | 3/2007 | Weiss et al. | |
| 2007/0097342 A1 | 5/2007 | Gomei et al. | |
| 2010/0033704 A1* | 2/2010 | Shiraishi | G02B 17/0663 355/71 |
| 2010/0071720 A1 | 3/2010 | Ehm et al. | |
| 2010/0288302 A1 | 11/2010 | Ehm et al. | |
| 2011/0048452 A1 | 3/2011 | Zink et al. | |
| 2011/0249245 A1* | 10/2011 | Janssen | F28D 15/00 355/30 |
| 2014/0192334 A1* | 7/2014 | Chen | G03F 7/70275 355/46 |

FOREIGN PATENT DOCUMENTS

| | | |
|---|---|---|
| DE | 10 2009 001 488 A1 | 11/2009 |
| JP | 2004153231 A | 5/2004 |
| JP | 2006529057 A | 12/2006 |
| JP | 2007067344 A | 3/2007 |
| JP | 2011504294 A | 2/2011 |
| WO | 2009/059614 A1 | 5/2009 |

OTHER PUBLICATIONS

German Office Action for DE 10 2011 079 450.6 dated Mar. 20, 2012.

Office Action in corresponding Japanese Application No. 2014520594, dated Jun. 17, 2016, along with an English translation.

* cited by examiner

OPTICAL ASSEMBLY WITH SUPPRESSION OF DEGRADATION

CROSS-REFERENCE TO RELATED APPLICATIONS

The present application is a Continuation of International Application No. PCT/EP2012/063101, filed on Jul. 5, 2012, claims the benefit under 35 U.S.C. 119(e) of U.S. Provisional Application No. 61/509,733 filed Jul. 20, 2011 063101, and further claims priority under 35 U.S.C. 119(a) to German Patent Application No. 10 2011 079 450.6 filed on Jul. 20, 2011. The entire contents of these three prior applications are hereby incorporated by reference into the disclosure of the present application in their respective entireties.

BACKGROUND OF THE INVENTION

The invention relates to an optical assembly, more particularly a projection exposure apparatus for microlithography, specifically for EUV lithography, and to a method for operating the optical assembly.

Microlithography projection exposure apparatuses serve for producing microstructured components by means of a photolithographic method. In this case, a structure-bearing mask, the so-called reticle, is imaged onto a photosensitive layer with the aid of a projection optical unit. The minimum feature size that can be imaged with the aid of such a projection optical unit is determined by the wavelength of the imaging light used. The smaller the wavelength of the imaging light used, the smaller the structures that can be imaged with the aid of the projection optical unit. Imaging light having the wavelength of 193 nm or imaging light having a wavelength in the range of the extreme ultraviolet (EUV), i.e. 5 nm-30 nm, is principally used nowadays. With the use of imaging light having a wavelength of 193 nm, both refractive optical elements and reflective optical elements are used within the microlithography projection exposure apparatus. With the use of imaging light having a wavelength in the EUV range, exclusively reflective optical elements (mirrors) are used, which are typically operated under vacuum conditions.

Mirrors of this type have a substrate composed of a material having a low coefficient of thermal expansion, and a reflective coating. If the wavelength of the imaging light used lies in the EUV range between 5 nm and 30 nm, the reflective coating typically comprises individual layers consisting alternately of materials having different refractive indices. During the operation of the projection exposure apparatus, the reflective coating is subjected to EUV radiation, which promotes a chemical reaction of the layer materials used with gaseous substances present in the residual gas atmosphere in the projection exposure apparatus.

In order to protect the individual layers against degradation, a capping layer is typically applied on the reflective coating in this case, which capping layer can consist of ruthenium, for example. However, on such a capping layer, too, a degradation—in the case of ruthenium an oxidation—can occur as a result of a chemical reaction with residual gas present in the vacuum environment, the chemical reaction being initiated or promoted by the EUV radiation. An oxidation of the capping layer during the operation of the projection exposure apparatus leads to a reduction of the reflectivity of the respective mirror and thus to a reduction of the lifetime of said mirror.

OBJECT OF THE INVENTION

It is an object of the invention to provide an optical assembly and an associated method in which the degradation of optical elements during operation can be effectively counteracted.

SUBJECT MATTER OF THE INVENTION

According to one aspect of the invention, this object is achieved with an optical assembly, in particular a projection exposure apparatus for microlithography, specifically for EUV lithography, comprising: a beam generating system generating radiation at an operating wavelength, at least one optical element which is subjected to the radiation and is arranged in a residual gas atmosphere, and a feed device feeding at least one gaseous constituent into the residual gas atmosphere in order to suppress a degradation of a surface of the optical element that is induced by the radiation, wherein either a beam diameter of the radiation at the surface of the optical element, in particular at the surfaces of all optical elements of the projection exposure apparatus, lies above a threshold value at which a suppression of the degradation by the gaseous constituent is typically still effective, or the beam diameter at the surface of the optical element lies below the threshold value so that effectiveness of the suppression of the degradation is reduces, and a further device for improving the suppression of the degradation of the surface is assigned to the optical element.

The inventors have recognized that the effectiveness of the suppression of the degradation of the surface of an optical element with the aid of a gaseous constituent in the residual gas atmosphere in which the optical element is arranged, given a predetermined power density, is surprisingly dependent on the beam diameter or on the size of the irradiated region on the optical element. When a threshold value of the beam diameter is undershot, a significant reduction of the effectiveness during the suppression of degradation occurs in this case.

The invention therefore proposes either choosing the optical design of the optical assembly such that the threshold value of the beam diameter is not undershot at least on the optical elements most greatly affected by the degradation (see below), if appropriate in the case of all the optical elements, or performing additional measures during the operation of the optical elements which make it possible to increase the effectiveness of the suppression of degradation.

In a projection exposure apparatus, the optical design and thus the beam path in the projection system are typically already defined during the production of the apparatus and can no longer be altered during operation. In the illumination system of the projection exposure apparatus, however, it is possible to vary the beam path and thus the beam diameters on the optical elements within certain limits. In this case, the illumination system can be designed such that, for all illumination settings, the threshold value of the beam diameter is not undershot. Alternatively, the illumination system can be designed such that undershoots of the threshold value occur, if appropriate, only for specific illumination settings, which undershoots can then be compensated for by the further device(s) during operation.

The inventors have recognized that the threshold value of the beam diameter is generally between approximately 1 mm and approximately 0.1 mm, in particular between approximately 0.7 mm and approximately 0.3 mm. In this case, the exact numerical value is dependent on further parameters, e.g. on the partial pressure of the gaseous constituent introduced into the projection exposure apparatus. However, even when said parameters are taken into account, the threshold value generally does not lie outside the interval specified above and is, in particular, less than 1 mm or less than 0.7 mm.

In one embodiment, the at least one optical element is subjected to radiation at a power density of more than 0.01 W/mm$^2$, in particular of more than 1 W/mm$^2$. The inventors have recognized that the problem of the greatly reduced efficiency of the suppression of degradation when a threshold value of the beam diameter is undershot typically occurs only above a threshold of the power density which lies in the range of the values specified above. Optical elements operated with power densities lying below the values specified above can therefore, if appropriate, also be operated with beam diameters lying below the threshold value, without the need for additional measures for improving the suppression of degradation.

In one embodiment, no further device for improved suppression of degradation is assigned to those optical elements of the optical assembly which have a beam diameter of the radiation at their surface which (permanently) lies above the threshold value. As indicated above, no additional measures have to be taken in order to improve the suppression of the degradation of the surfaces of such optical elements, so that the need for assigning/providing further devices for improving the suppression of degradation at these optical elements is dispensed with.

In one embodiment, the feed device is designed to feed hydrogen to the residual gas atmosphere. In this case, the oxidation of the material of the surface of the optical element is intended to be counteracted by said element being operated in a reducing residual gas atmosphere with a proportion of hydrogen. The hydrogen is activated by the radiation, in particular at EUV wavelengths, in the vicinity of the optical element and is converted into hydrogen radicals or hydrogen ions, which react with the material at the surface of the optical element in order to reverse or prevent the oxidation.

In order to bring this about, it has proved to be of advantage if the hydrogen partial pressure in the residual gas atmosphere is at least $1 \times 10^{-3}$ mbar, if appropriate also above that, for example $1 \times 10^{-2}$ mbar or $5 \times 10^{-2}$ mbar. If the material at the surface of the optical element is an oxide material, it is possible, of course, instead of a reducing constituent (e.g. hydrogen), to introduce an oxidizing constituent (e.g. oxygen) into the residual gas atmosphere in order to counteract a degradation (in this case: a reduction) of the oxide material at the surface.

In one embodiment, the further device comprises a heating device for heating the optical element and thus the surface of the optical element. By heating the surface, it is possible to influence the reaction equilibrium of the chemical reactions at the surface in favor of the suppression of degradation. Heating wires, Peltier elements, etc., can serve as heating devices. It has proved to be of advantage to provide the heating device at the underside of the substrate in order to be able to heat the substrate over the whole area.

In this case, the heating device can be designed to heat the surface to a temperature of more than 30° C., if appropriate of 100° C. or above. At these temperatures, the reaction equilibrium is effectively shifted in favor of the suppression of the degradation.

In a further embodiment, the further device comprises a cleaning head, which is designed to generate a gas flow directed onto the surface. Cleaning heads of this type can be used to remove contaminants from the surfaces of optical elements, as is described for example in WO 2009/059614 A1 from the present applicant, which is incorporated by reference in the content of this application. In the present case, the cleaning head is oriented toward that region at the surface of the optical element at which the radiation also impinges.

In one development, the gas flow directed onto the surface contains activated hydrogen. In this case, the hydrogen can be activated within the cleaning head, for example using an electric field, as is described in WO 2009/059614 A1, or optionally by the (molecular) hydrogen being guided along a heating wire for the purpose of activation.

In addition or as an alternative to the two measures described above (feeding a cleaning gas and heating the surface), further measures can also be carried out in order to improve the suppression of the degradation of the surface of the optical element if the beam diameter is below the threshold value.

A further aspect of the invention relates to a method for operating an optical assembly, in particular a projection exposure apparatus for EUV lithography, wherein at least one optical element is arranged in a residual gas atmosphere and is subjected to radiation at an operating wavelength, the method comprising: feeding at least one gaseous constituent into the residual gas atmosphere for suppressing a degradation of a surface of the optical element that is induced by the radiation, irradiating the surface of the optical element with radiation whose beam diameter at the surface is less than a threshold value at which a suppression of the degradation can effectively take place with the gaseous component, and carrying out at least one further measure for intensifying the suppression of the degradation of the surface of the optical element.

As has been explained further above, during the operation of the optical apparatus, the beam diameter at the optical elements can vary, if appropriate, depending on specific parameters. By way of example, the beam diameter at the optical elements in an illumination system may be dependent on the respective illumination settings. If the illumination settings are chosen such that the threshold value is undershot, additional measures for improving the effectiveness of the suppression of degradation are carried out. Such measures may be carried out on individual optical elements, if appropriate on all optical elements of the optical assembly, if appropriate permanently, while the optical assembly is in operation.

The threshold value of the beam diameter at which the suppression of degradation is still effective without the introduction of further measures is dependent on further parameters such as e.g. the partial pressure of the gaseous constituent in the residual gas atmosphere and therefore fluctuates within certain limits, which are typically between approximately 1 mm and 0.1 mm.

As has already been described further above in connection with the optical assembly, a significant decrease in the effectiveness of the suppression of degradation in the case of small beam diameters typically occurs only if the optical element is subjected to radiation at a power density of more than 0.01 W/mm$^2$.

In one variant of the method described above, the surface of the optical element or of at least one further optical element is irradiated with radiation whose beam diameter lies above the threshold value and no further measures for intensifying the suppression of degradation are carried out at the optical element or at the at least one further optical element. As has been described above, measures for intensifying the suppression of degradation can be dispensed with in this case. It will be understood that especially for optical elements in the illumination system, the beam diameter may change during the operation, such that it lies above the threshold value in a first operating state and below the threshold value in a second operating state (the operating state depending e.g. on the illumination settings). In this case, the additional measures may be activated if required, typically when a change from the first to the second operating state occurs.

For an effective suppression of degradation, a minimum partial pressure of the gaseous constituent in the residual gas atmosphere is typically required, which is generally at least approximately $1 \times 10^{-3}$ mbar and can be varied during operation—if necessary.

In one variant, the measures for intensifying the suppression of degradation comprise feeding a directed gas flow to the surface of the optical element. In this case, the directed gas flow can contain a gaseous component corresponding to the gaseous constituent which was introduced into the residual gas atmosphere for the purpose of suppressing contamination. The gaseous component of the directed gas flow can be activated in a manner other than by EUV radiation (e.g. by heat, etc.), and can in this case be converted into ions or radicals, for example.

In a further variant, the measures for intensifying the suppression of degradation comprise heating the surface of the optical element. With the heating, it is likewise possible to improve the effect of the suppression of degradation, wherein temperatures of 30° C. or higher at the surface have proved to be of advantage.

Further features and advantages of the invention will become apparent from the following description of exemplary embodiments of the invention, with reference to the figures of the drawing which show details essential to the invention, and from the claims. The individual features can be realized in each case individually per se or as a plurality in any desired combination according to the invention.

BRIEF DESCRIPTION OF THE DRAWINGS

Exemplary embodiments are illustrated in the schematic drawing and are explained in the description below. In the figures.

DETAILED DESCRIPTION OF EXEMPLARY EMBODIMENTS

Figure 1:
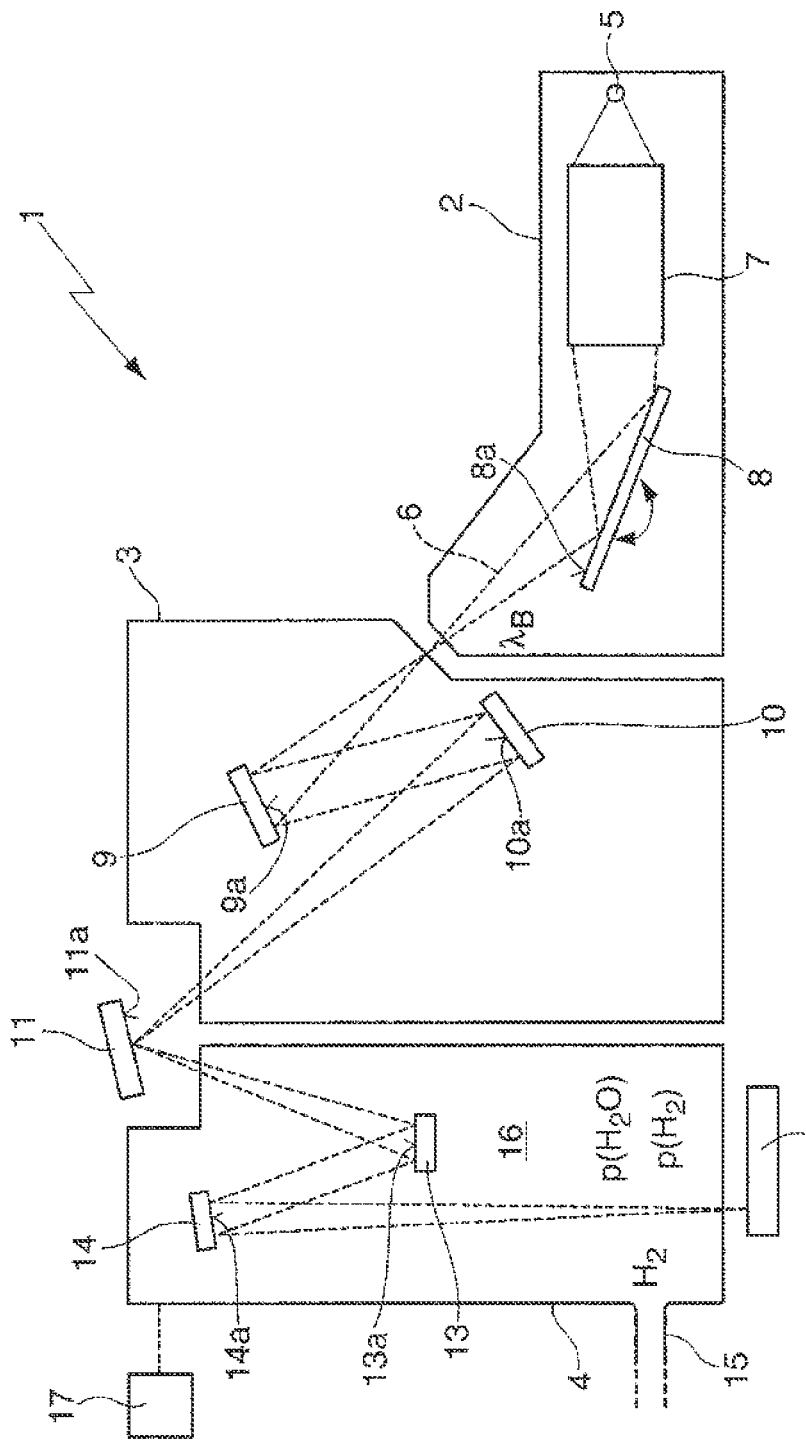
FIG. 1 shows a schematic illustration of a projection exposure apparatus for EUV lithography.

FIG. 1 schematically shows a projection exposure apparatus 1 for EUV lithography. The projection exposure apparatus 1 comprises a beam generating system 2, an illumination system 3 and a projection system 4, which are accommodated in separate vacuum housings and arranged successively in a beam path 6 proceeding from an EUV light source 5 of the beam shaping system 2. By way of example, a plasma source or a Synchrotron can serve as the EUV light source 5. The radiation emerging from the light source 5 in the wavelength range of between approximately 5 nm and approximately 20 nm is firstly concentrated in a collimator 7. With the aid of a downstream monochromator 8, the desired operating wavelength $\lambda_b$ is filtered by varying the angle of incidence, as indicated by a double-headed arrow. The collimator 7 and the monochromator 8 are embodied as reflective optical elements.

The radiation treated in the beam generating system 2 with regard to wavelength and spatial distribution is introduced into the illumination system 3, which comprises a first and a second reflective optical element 9, 10. The two reflective optical elements 9, 10 direct the radiation onto a photomask 11 as further reflective optical element, which has a structure that is imaged onto a wafer 12 on a reduced scale by the projection system 4. For this purpose, a third and a fourth reflective optical element 13, 14 are provided in the projection system 4.

The reflective optical elements 9, 10, 11, 13, 14 have a respective optical surface 9a, 10a, 11a, 13a, 14a, which is subjected to the EUV radiation 6 from the light source 5. In this case, the optical elements 9, 10, 11, 13, 14 are operated under vacuum conditions in a residual gas atmosphere 16, which is illustrated by way of example for the projection system 4 in FIG. 1. A corresponding residual gas atmosphere prevails in the entire projection exposure apparatus 1, i.e. also in the illumination system 3 and in the beam generating system 2. Water vapor, the partial pressure $p(H_2O)$ of which is approximately $1 \times 10^{-7}$ mbar, is present in the residual gas atmosphere 16. Furthermore, a small proportion of oxygen ($p(O_2)$ approximately $1 \times 10^{-9}$ mbar) is present in the residual gas atmosphere 16. Since the interior of the projection exposure apparatus 1 cannot be baked out, the presence of these residual gas constituents cannot be completely avoided.

The optical elements 13, 14 in the projection system 4, the optical elements 9, 10 in the illumination system 3 and the reticle 11 can in this case be subjected to EUV radiation 6 at a power density of more than 1 W/mm². Since the reflectivity of a respective optical element 9, 10, 11, 13, 14 for EUV radiation is typically less than 70%, the power density decreases proceeding from the light source 5 upon each reflection at an optical element 9, 10, 11, 13, 14, such that the power density at some of the optical elements can, if appropriate, also be below the value specified above.

A feed device 15 in the form of a feed channel connected to a gas reservoir (not shown) serves for feeding hydrogen $H_2$ to the residual gas atmosphere 16. Corresponding feed devices can also be provided in the illumination system 3 and/or in the beam generating system 2, or else alternatively a central feed device can be provided for the entire projection exposure apparatus 1. A control device 17 serves for controlling the feed device 15 and for controlling further functions of the projection exposure apparatus 1.

By feeding hydrogen $H_2$ to the projection system 4, the intention is to attenuate or suppress a degradation of the surfaces 13a, 14a of the optical elements 13, 14 by the EUV radiation 6. In order to be able to comprehend this, the construction of the first optical element 13 of the projection system 4 is described in detail below in connection with FIG. 2.

The optical element 13 comprises a substrate 20 composed of a material having a low coefficient of thermal expansion, which is typically less than 100 ppb/K at 22° C. or over a temperature range of approximately 5° C. to approximately 35° C. One material which has these properties is silicate or quartz glass doped with titanium dioxide, which typically has a silicate glass proportion of more than 90%. One such silicate glass that is commercially available is sold by Corning Inc. under the trade name ULE® (Ultra Low Expansion glass). A further group of materials having a very low coefficient of thermal expansion is glass ceramics, in which the ratio of the crystal phase to the glass phase is set such that the coefficients of thermal expansion of the different phases virtually cancel each other out. Such glass ceramics are offered e.g. by Schott AG under the trade names Zerodur® or by Ohara Inc. under the trade name Clearceram®.

A reflective coating 21 is applied to the substrate 20, said coating comprising a plurality of individual layers consisting of different materials. In the present case, the individual layers consist alternately of materials having different refractive indices. If the operating wavelength $\lambda_b$ is approximately 13.5 nm, as in the present example, then the individual layers usually consist of molybdenum and silicon. Other material combinations such as e.g. molybdenum and beryllium, ruthenium and beryllium or lanthanum and $B_4C$ are likewise possible. In addition to the individual layers described, the reflective coating 21 can also comprise intermediate layers for preventing diffusion. The illustration of such auxiliary layers in the figures has been dispensed with.

A capping layer 22 is applied to the reflective coating 21 in order to prevent oxidation of the underlying individual layers. The capping layer 22 consists of ruthenium in the present example. Other materials, in particular metals, can also be used for the capping layer 22. In this case, the capping layer 22 is transmissive to the EUV radiation 6.

In the exemplary embodiment illustrated, the optical element 13 has a planar surface. This was chosen thus only to simplify the illustration, that is to say that the optical element 13 can also have a curved surface form, wherein e.g. concave surface forms or convex surface forms are possible, which can be embodied both spherically and aspherically.

The ruthenium of the capping layer 22 is oxidized by the water vapor in the residual gas atmosphere 16, more specifically in the region of the surface 13a of the optical element 13, said surface being formed at the top side of the capping layer 22, in accordance with the following chemical reaction:

$$H_2O + Ru \rightarrow RuO_x + H_2 \quad (1)$$

The oxidation of the ruthenium capping layer 22 leads to a degradation of the optical element 13, more specifically to a reduced reflectivity of the optical element 13. In order to reduce or suppress this, the hydrogen gas $H_2$ is introduced into the residual gas atmosphere 16. In this case, the hydrogen $H_2$ is converted into activated hydrogen $H^+$ in the region in which EUV radiation 6 is present. Activated hydrogen $H^+$ is understood to mean not only hydrogen ions ($H^+$, $H_2^+$) but also hydrogen radicals H• and hydrogen in an excited electron state $H^*$. The activated hydrogen $H^+$ in the region of the surface 13a can bring about a reduction of the oxidized ruthenium in accordance with the following chemical reaction:

$$RuO_x + 2H^+ \rightarrow Ru + H_2O \quad (2)$$

A partial pressure $p(H_2)$ of the hydrogen $H_2$ in the residual gas atmosphere 16 is chosen in this case such that such a chemical reaction can proceed to a sufficient extent. In this case, typical partial pressures $p(H_2)$ of the activated hydrogen $H^+$ are in the range of more than $10^{-3}$ mbar, e.g. $3 \times 10^{-3}$ mbar or higher.

Figure 2:
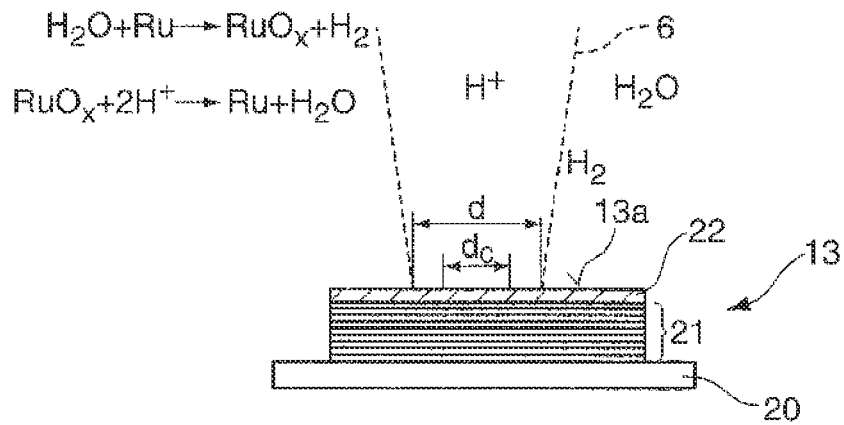
FIG. 2 shows a schematic illustration of a mirror of the projection exposure apparatus from FIG. 1, wherein impinging EUV radiation has a beam diameter above a threshold value.

In the exemplary embodiment shown in FIG. 2, the radiation 6 at the surface 13a of the reflective optical element 13 has a minimum beam diameter d, which is greater than a threshold value $d_c$, which is approximately 0.5 mm in the present example. In the case of non-rotationally symmetrical intensity distributions, the beam diameter is in this case measured along that direction in which the intensity distribution has its minimum extent, i.e.—for example in the case of an elliptical beam geometry—along the smaller radius of the ellipse. In this case, the beam diameter d is defined as the width at which the intensity of the radiation 6 along this direction is half of the intensity maximum (FWHM "full width half maximum").

In the case of an intensity distribution of the radiation 6 for which the beam diameter d is greater than the threshold value $d_c$, as is illustrated in FIG. 2, the degradation can be effectively attenuated by the gaseous constituent $H_2$ since the above-described chemical reaction of the capping layer 22 with the activated hydrogen $H^+$ can take place to a sufficient extent.

In the case of beam diameters d which lie below the threshold value $d_c$, this is not the case particularly at power densities of more than 0.01 W/mm², i.e. here the chemical reaction for suppressing the degradation or for oxidation does not proceed to a sufficient extent. In order to ensure that a degradation and an associated reduction of the lifetime can be counteracted on all optical elements 9 to 11, 13, 14 of the projection exposure apparatus 1, there are various possibilities:

In the first possibility, the projection exposure apparatus 1 is designed such that the minimum beam diameter d at the surfaces 9a to 11a, 13a, 14a of all optical elements 9 to 11, 13, 14 which are subjected to the radiation 6, or at least at those optical elements which are subjected to power densities of more than 0.01 W/mm² are greater than the threshold value $d_c$ (wherein an "optical element" is understood to include the reticle 11). In this way, a degradation of the optical elements 9 to 11, 13, 14 can be prevented without the provision of additional measures. In particular, in this case, the illumination system 3 can also be designed such that for all possible illumination settings (dipole illumination, dark field illumination, etc.) the threshold value $d_c$ is not undershot.

Figure 3:
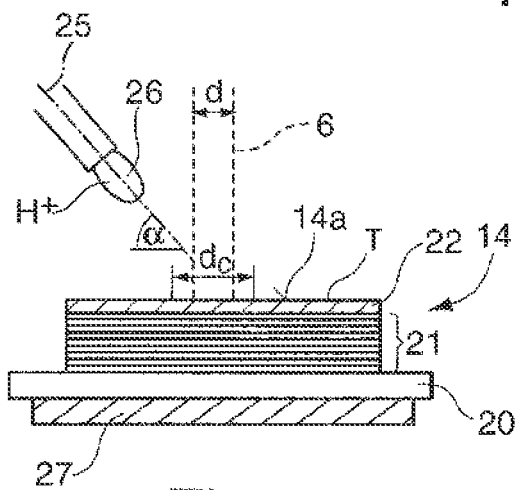
FIG. 3 shows a schematic illustration of a further mirror, wherein the beam diameter is below the threshold value.

If the optical design of the projection exposure apparatus 1 cannot be chosen, or is not intended to be chosen, such that all relevant beam diameters d are greater than the threshold value $d_c$, additional measures can be provided in order to improve the suppression of degradation, as is illustrated by way of example on the basis of the second optical element 14 of the projection system 4 in FIG. 3.

In the example illustrated in FIG. 3, the beam diameter d of the radiation 6 at the surface 14a of the optical element 14 is approximately 0.1 mm and thus distinctly below the threshold value $d_c$ of 0.5 mm. In order nevertheless to achieve the effect that the above-explained chemical reaction (2) proceeds to a sufficient extent, the optical element 14 is assigned a cleaning head 25 serving for generating a gas flow 26, by which activated hydrogen $H^+$ is applied to the surface 14a of the optical element 14. In this case, the cleaning head 25 is arranged outside the beam path 6 and oriented at an angle α with respect to the surface 14a, said angle being chosen such that the gas flow 26 impinges on the surface 14a at least partly in the same surface region as the EUV radiation 6. By feeding additional activated hydrogen H⁺ to the surface 14*a*, it can be ensured that the above-described reaction (2) of the oxidized ruthenium takes place to a sufficient extent.

As an alternative or in addition to the cleaning head 25, a heating device 27 can also be fitted to the optical element 14, said heating device likewise being illustrated in FIG. 3. In the present example, the heating device 27, which can be embodied e.g. in the form of a planar heating wire, a Peltier element or the like, is arranged below the substrate 20 and heats the substrate as well as the reflective coating 21 and the capping layer 22. In this case, the heating element 27 is designed such that the surface 14*a* of the optical element 14 can be heated to a temperature T of at least 30° C. By heating the optical element 14 or the capping layer 14*a*, the reaction equilibrium of the chemical reaction (2) described above is shifted toward the reaction products, such that the degradation of the optical element 14 or of the capping layer 22 can likewise be effectively suppressed. Further measures can also be provided in order to improve the suppression of degradation.

If the beam diameter d on the optical elements 9 to 11, 13, 14 changes during operation, such that it lies above the threshold value in a first operating state and below the threshold value in a second operating state, which may be the case particularly for the optical elements 9, 10 of the illumination system 3, the control device 17 can activate or deactivate the heating element 27 and/or the cleaning head 25 as required. For example, in the first operating state the suppression of degradation can be effected just by the hydrogen constituent of the residual gas atmosphere 16, while in the second operating state the heating element 27 and/or the cleaning head 25 are/is additionally activated.

Figure 4:
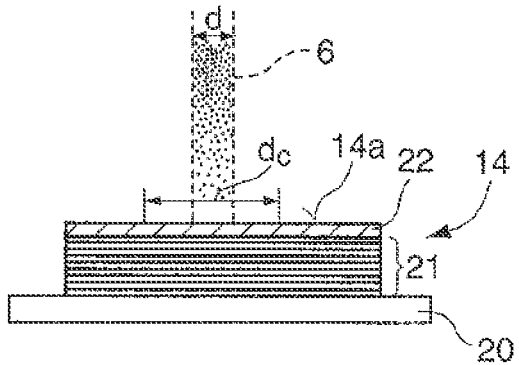
FIG. 4 shows a further illustration of the mirror from FIG. 3 for elucidating the plasma formation in the region of the EUV radiation.
Figure 5:
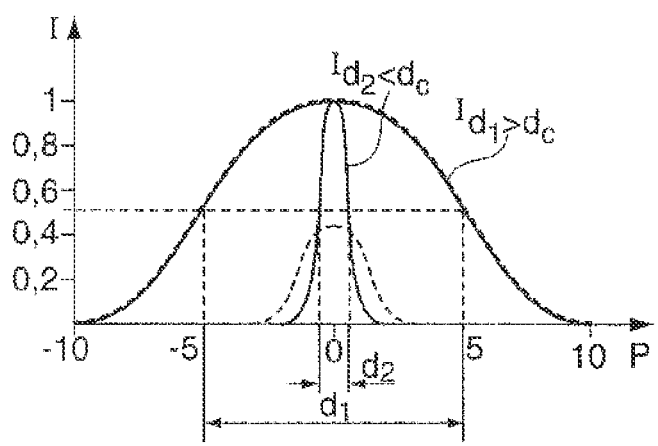
FIG. 5 shows an illustration of two intensity distributions of the EUV radiation on the optical surface of a mirror, in the case of which the beam diameter lies below and above a threshold value, respectively.

With reference to FIGS. 4 and 5, two possible explanations are given below as to why, when the threshold value $d_c$ of the beam diameter d is undershot, the suppression of degradation by the use of hydrogen H₂ in the residual gas atmosphere 16 is inhibited.

FIG. 4 illustrates by way of example (by a plurality of dots) a plasma in the region of the radiation 6 impinging on the optical element 14. In the case of a beam diameter d below the threshold value $d_c$ said plasma no longer reaches as far as the surface 14*a*, as would be the case (not shown) for a larger beam diameter d>$d_c$ (and identical power density). As a result of the collapse of the plasma near the surface 14, only an insufficient amount of activated hydrogen H⁺ is still present there, and so the chemical reaction (2) described above is inhibited.

A further explanation for the dependence of the chemical reaction (2) described above on the beam diameter d could lie in an increasing diffusion of activated hydrogen H⁺ in the case of small beam diameters d, that is to say that in the case of smaller beam diameters d the activated hydrogen H⁺ spreads to a greater extent and passes out of the region at which the radiation 6 impinges on the surface 14*a* of the optical element 14. This also reduces the proportion of activated hydrogen available for the chemical reaction (2).

The dependence of the diffusion on the beam diameter can be better understood with reference to FIG. 5, which shows a radiation intensity I as a function of the position P (in arbitrary units). A first intensity profile $I_{d1}$ in this case has a beam diameter d of 10 ($d_1$>$d_c$), while a second intensity profile $I_{d2}$ has a significantly smaller beam diameter d of 1 ($d_2$<<$d_c$). In the case of the wide beam profile ($d_1$>$d_c$), the intensity distribution $I_{d1}$ (illustrated as a solid line) corresponds to the intensity distribution (illustrated in a dashed fashion) produced by the diffusion. In the case of small beam diameters ($d_2$<<$d_c$), the diffusion leads in contrast to a widening of the intensity curve (illustrated in a dashed fashion) and thus to a reduced effectiveness of the above-described mechanism for attenuating the degradation.

In the above example, hydrogen as gaseous constituent was introduced into the residual gas atmosphere 16 in order to suppress the degradation or the oxidation of the ruthenium capping layer 22 by virtue of the oxidized material of the capping layer 22 being reduced by the chemical reaction (2). As an alternative to the use of a capping layer 22 whose oxidation is intended to be prevented, it is also possible to use a capping layer composed of an oxidic material. In this case, an oxygen-containing constituent (e.g. oxygen) can be introduced into the residual gas atmosphere in order to suppress or attenuate a degradation (in this case a reduction of the oxide material). In such an oxygen-containing residual gas atmosphere, too, it is possible to carry out the above-described additional measures (heating, applying a gas flow) in order to counteract a degradation of the surface.

Although the above description has been given in connection with a projection exposure apparatus 1 for EUV lithography, the procedure described above can also be applied to other optical assemblies, for example to inspection devices for inspecting masks or wafers, or to projection exposure apparatuses for higher wavelengths (DUV), which are typically operated with imaging light at wavelengths of more than 150 nm, e.g. at 193 nm, in particular in the case of so-called catadioptric projection lenses.

The present invention has been described by way of exemplary embodiments to which it is not limited. Variations and modifications will occur to those skilled in the art without departing from the scope of the present invention. Applicant seeks to cover the full scope of the present invention, as recited in the appended claims and including equivalents thereof.

The invention claimed is:
1. Optical assembly, comprising:
   a beam generating system generating radiation at an operating wavelength ($\lambda_b$),
   at least a first optical element and a further optical element, wherein the first and the further optical elements are arranged in a residual gas atmosphere and are subjected to the radiation, which induces a degradation of a first surface of the first optical element and of a further surface of the further optical element,
   a feed device feeding at least one gaseous constituent into the residual gas atmosphere, to suppress the degradation of the further surface of the optical element that is induced by the radiation, wherein:
      a beam diameter (d1) at the first surface of the first optical element lies below a threshold value ($d_c$) sufficient to suppress the degradation by the gaseous constituent, and
      a beam diameter (d2) of the radiation at the surface of the further optical element lies above the threshold value ($d_c$) sufficient to suppress the degradation by the gaseous constituent, and
   a further device assigned to the first optical element but not to the further optical element, and configured to suppress the degradation of the surface of the first optical element, wherein the further optical element is assigned no device configured to suppress the degradation of the surface of the further optical element, and
   wherein the threshold value ($d_c$) is between 1 mm and 0.1 mm.

2. The optical assembly according to claim 1, wherein the first optical element is subjected to radiation at a power density of more than 0.01 W/mm².

3. The optical assembly according to claim 1, wherein the feed device feeds hydrogen ($H_2$) to the residual gas atmosphere.

4. The optical assembly according to claim 3, wherein the hydrogen partial pressure ($p(H_2)$) in the residual gas atmosphere is at least $1 \times 10^{-3}$ mbar.

5. The optical assembly according to claim 1, wherein the further device comprises a heating device heating the first optical element.

6. The optical assembly according to claim 5, wherein the heating device heats the first surface to a temperature of more than 30° C.

7. The optical assembly according to claim 1, wherein the further device comprises a cleaning head, which generates a gas flow directed onto the first surface.

8. The optical assembly according to claim 7, wherein the gas flow directed onto the first surface contains activated hydrogen ($H^+$).

9. Method for operating an optical assembly, wherein at least a first optical element and a further optical element, wherein the first and the further optical elements are arranged in a residual gas atmosphere and are subjected to radiation at an operating wavelength ($\lambda_b$) that induces a degradation of a first surface of the first optical element and of a further surface of the further optical element, the method comprising:

feeding at least one gaseous constituent sufficient to suppress the degradation of the further surface of the further optical element into the residual gas atmosphere, irradiating the first surface of the first optical element with radiation that has a beam diameter (d) at the first surface that is less than a threshold value ($d_c$) sufficient to suppress the degradation at the first surface, wherein the threshold value ($d_c$) is between 1 mm and 0.1 mm, and carrying out at least one further measure to enhance the suppression of the degradation of the first surface of the first optical element but not to the further optical element, wherein the further optical element is assigned no device configured to suppress the degradation of the surface of the further optical element.

10. The method according to claim 9, wherein the gaseous constituent is hydrogen gas.

11. The method according to claim 9, wherein the first optical element is subjected to radiation at a power density of more than 0.01 W/mm².

12. The method according to claim 9, wherein a partial pressure of the gaseous constituent in the residual gas atmosphere is at least $1 \times 10^{-3}$ mbar.

13. The method according to claim 9, wherein the further measure to enhance the suppression of the degradation comprises feeding a directed gas flow to the surface of the optical element.

14. The method according to claim 9, wherein the further measure to enhance the suppression of the degradation comprises heating the first surface of the first optical element.

15. The optical assembly according to claim 1, wherein the optical assembly is a projection exposure apparatus configured for extreme ultraviolet lithography.

16. The optical assembly according to claim 1, wherein the threshold value ($d_c$) is between 0.7 mm and 0.3 mm.

17. The method according to claim 9, wherein the threshold value ($d_c$) is between 0.7 mm and 0.3 mm.

* * * * *